PRODUCTION OF CONTACT PADS FOR SEMICONDUCTORS

Filed May 12, 1965

INVENTOR
Darnall P. Burks
BY Connolly and Hutz
ATTORNEYS

United States Patent Office 3,380,155
Patented Apr. 30, 1968

3,380,155
PRODUCTION OF CONTACT PADS FOR SEMICONDUCTORS

Darnall P. Burks, Williamstown, Mass., assignor to Sprague Electric Company, North Adams, Mass., a corporation of Massachusetts Filed May 12, 1965, Ser. No. 455,057
3 Claims. (Cl. 29—591)

ABSTRACT OF THE DISCLOSURE

A flanged lead is bonded to a metallized area on a semiconductor chip. The lead is then flamed-off immediately adjacent the flange so as to melt any remaining lead and the external surface of the flange to thereby leave a smooth surfaced contact pad.

This invention relates to a process for producing semiconductor devices, and more particularly to a process for producing semiconductor devices having attached contact pads.

Semiconductors are generally produced by forming zones or regions exhibiting different electrical conductivity within a semiconductor material, such as silicon or the like, by the addition of suitable impurities. The device is then completed by the attachment of leads to one or more of such zones or, as in micro-miniaturized circuits, by connecting the zones directly to circuit contacts.

High reliability, as well as cost factors, demand exceptional quality control of all phases of semiconductor processing. Included, in such control, should be adequate electrical test at early phases of production. At the present time, however, because of the difficulty of making a low resistance electrical contact to the device, initial tests are generally restricted to D.C. tests of limited accuracy.

This places severe restriction on the control of semiconductor production since the quality of the device is not sufficiently known until the product is essentially complete.

In the case where individual semiconductors are produced, that is where leads are attached in the final stages, such delay in effective electrical control is damaging enough; however, in the present state of the art, where a plurality of such devices are aften bonded directly to circuit contacts as in multichip or hybrid units, the problem is further aggravated.

Referring to the drawing.

In its broadest scope, the process according to the invention comprises the steps of forming a semiconductor chip, joining at least one lead to the chip, and severing the lead above the joint to provide a contact pad attached to the chip.

In a more limited sense, the process according to the invention comprises the steps of: forming a semiconductor chip; metallizing an area of the chip; forming a lead having a flange at one end; diffusion bonding the lead flange to the metallized area of the chip; flaming off the lead close to the flange; and melting any remaining attached portion of the lead along with the external surface of the flange to leave a contact pad in connection to the chip.

Figure 1:
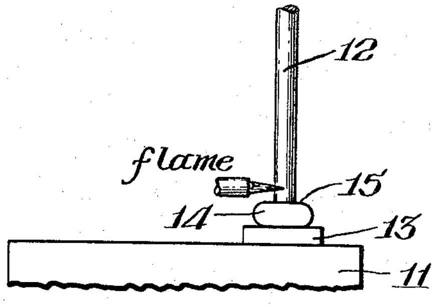
FIGURE 1 is a drawing in section of a semiconductor device in an initial stage in the process of fabrication according to this invention.

Referring now to FIGURE 1, a semiconductor chip 11 is shown with a lead 12 bonded by a flange 14 upon a metallized area 13 of the chip 11. This is an illustration of an early phase in the process of fabricating the semiconductor with contact pad according to the preferred embodiment of this invention.

The chip 11 is formed by suitable means such as growing, alloying or diffusion of zones of varied electron mobility within a silicon or germanium crystal or the like, whereas lead 12 with a ball-shaped flange 14 is formed by suitable means such as by melting one end of lead 12 to allow the lead end to form an approximate ball shape.

In the preferred embodiment a metallized area 13 is deposited upon one of the zones of the chip 11 by suitable means, such as plating or vapor deposition or the like, to provide an alloying material, such as aluminum, chromium, silver, gold or the like, to facilitate the joining of the lead 12 to the chip 11.

Joining of the lead 12 is accomplished in this embodiment by diffusion bonding, such as thermocompression bonding described by H. Christensen, in "Electrical Contact with Thermo-Compression Bonds," Bell Laboratories Record, vol. 30, No. 4, April 1958, pp. 127–130. For example, flange 14 is butted under pressure against the metallized area 13 while the assembly is heated at suitable temperature, approximately 300° C. to alloy the lead and semiconductor materials. Other means of bonding such as diffusion bonding by ultrasonic means or welding or soldering or the like may be employed.

Figure 2:
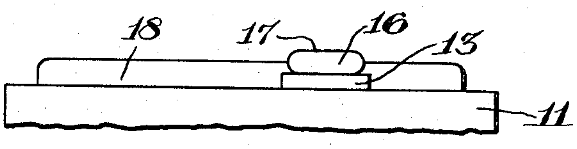
FIGURE 2 is a drawing in section of a semiconductor device having attached contact pad fabricated according to this invention.

To complete the contact pad 16 as shown in FIGURE 2, the lead 12 is severed close to the flange surface 15 to leave a substantially smooth surface for electrical contact. This is accomplished, in the preferred embodiment described herein, by flaming off the lead 12 above the bonded flange 14 so as to sever and melt back the lead 12 at that point.

Flange 14 furnishes a bearing surface 15 for application of pressure during diffusion bonding and also facilitates the severing of the lead by providing a thin lead diameter. A suitable flange size of approximately .003" diameter is formed from .001 gold wire or the like by melting the lead end as described.

Various wire sizes and corresponding flange sizes may be utilized to practice the invention, however, since the force required to produce the desired pressure for thermocompression bonding will, of course, increase with contact area, difficulty with wire sizes in excess of .005" is to be anticipated and would normally require a different bonding method.

The flaming off is accomplished by directing a concentrated intense flame at lead 12, at a point just above the flange surface 15 as shown in FIGURE 1. A free burning hydrogen flame is employed, so as to avoid difficulties of control associated with intense flames produced from mixed gases such as oxygen fed flames. The hydrogen flame is produced by burning a small jet of hydrogen in air. This produces a relatively constant flame of high temperature concentrated over a very small area. A flame produced by other means may also be utilized, however, as noted above, some difficulty in control may result. The lead 12 is severed by melting through at this point. The remaining attached lead stub along with the surface 15 of the flange 14 is simultaneously or subsequently melted so that the surface tension of the molten metal will form a ball shaped contact 16 with substantially smooth surface 17.

Satisfactory electrical tests may then be conducted by making contact to the pad 16 with a standard test probe. Additional zones may be subsequently formed in the chip 11 and pads attached by the described process. When the device is complete, pad 16 and other similar pads will be available for test purposes and for permanent connections. Thus, after completion of the device, leads may be attached by suitable means, such as by diffusion bonding, soldering or the like, or the device may be connected, along with others, directly in a circuit unit such as is shown in FIGURE 3.

The pad also provides a raised surface for contact to a hermetically sealed unit. Thus in FIGURES 2 and 3, pad 16 protrudes through a passivating layer 18 which was deposited after the pad 16 was completed. During such deposit, it may be necessary to mask the pad 16 so as to provide a clean contact surface for later use.

Figure 3:
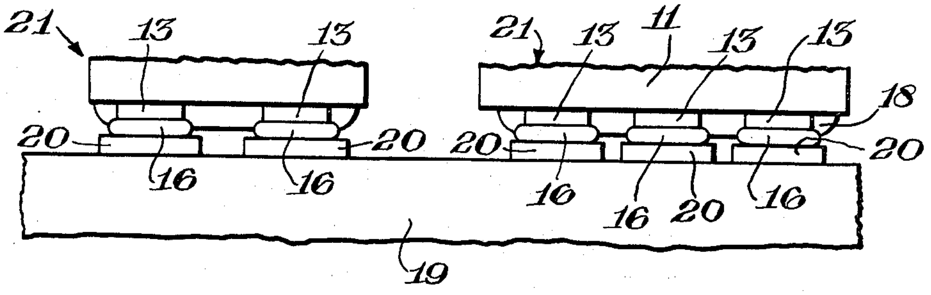
FIGURE 3 is a drawing in section of a circuit unit with semiconductor devices attached by means of pads produced according to this invention.

In FIGURE 3, two semiconductor devices 21 produced by the above process, are shown connected directly to a substrate 19 by contact pads 16. The substrate is shown with metallized areas 20, such as gold or the like, which facilitates the connection of the pads 16 to the stubstrate 19. The connection may be made by any suitable means such as the diffusing bonding described above, or soldering, or the like.

A modification of this invention is the forming of pads from leads attached without the use of a flange. For example, a short portion of the lead may be bent at an acute angle, thereafter the short portion bonded to the semiconductor by suitable means and the remainder of the lead then flamed off. A straight lead may also be butt bonded to the semiconductor and then flamed off, although some difficulty in the holding of such a lead or in the application of pressure to the contacting face is to be anticipated.

Although the device has been described as regards the attachment of an individual contact pad, it should be understood that a plurality of such pads could be attached to different zones of the chip simultaneously, or individual pads may be attached after different stages of production, so that adequate electrical control may be maintained throughout the production of the semiconductor.

Where a plurality of pads are to be formed from simultaneously attached leads, it is desirable to provide for inequalities in the height of the flanges by providing relatively soft lead material or individual clamping means for each lead.

Furthermore, although the invention has been described in terms of a preferred specific embodiment, it should be understood that many different embodiments of this invention may be made without departing from the spirit and scope hereof and that the invention is not to be limited except as defined in the appended claims.

What is claimed is:

1. A process for making a semiconductor device which includes the production of a contact pad for said device comprising producing a metallized area on a semiconductor chip, bonding a flanged lead to said metallized area, flaming off said lead immediately adjacent said flange so as to melt any remaining lead and the external surface of the flange to thereby leave a smooth surfaced contact pad.

2. The process of claim 1 and further including the production of a passivating layer on said chip through which the contact pad protrudes, leaving said smooth surface exposed.

3. The process of claim 2 wherein a plurality of said pads is provided to extend individually through said passivating layer.

References Cited

UNITED STATES PATENTS

| | | | |
|---|---|---|---|
| 2,137,617 | 11/1938 | Imes | 29—155.55 |
| 3,006,067 | 10/1961 | Anderson | 29—470 |
| 3,286,340 | 11/1966 | Kritzler | 29—471.1 |

WILLIAM I. BROOKS, *Primary Examiner.*